United States Patent
Wei et al.

(10) Patent No.: US 11,029,555 B2
(45) Date of Patent: *Jun. 8, 2021

(54) COLOUR FILM SUBSTRATE AND MANUFACTURING METHOD THEREFOR, AND DISPLAY PANEL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiongzhou Wei, Beijing (CN); Min Li, Beijing (CN); Qiang Xiong, Beijing (CN); Chao Liu, Beijing (CN); Jiaqi Pang, Beijing (CN); Bin Wan, Beijing (CN); Hongyu Sun, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 134 days.

This patent is subject to a terminal disclaimer.

(21) Appl. No.: 16/316,909

(22) PCT Filed: May 14, 2018

(86) PCT No.: PCT/CN2018/086654
§ 371 (c)(1),
(2) Date: Jan. 10, 2019

(87) PCT Pub. No.: WO2018/223811
PCT Pub. Date: Dec. 13, 2018

(65) Prior Publication Data
US 2019/0293995 A1 Sep. 26, 2019

(30) Foreign Application Priority Data

Jun. 6, 2017 (CN) .......................... 201710418842.2

(51) Int. Cl.
*G03F 7/40* (2006.01)
*G03F 7/105* (2006.01)
(Continued)

(52) U.S. Cl.
CPC ...... *G02F 1/133516* (2013.01); *G02F 1/1335* (2013.01); *G02F 1/133512* (2013.01);
(Continued)

(58) Field of Classification Search
CPC ............. G02F 1/133512; G02F 1/1335; G02F 1/133516; G03F 7/007; G03F 7/40;
(Continued)

(56) References Cited

U.S. PATENT DOCUMENTS 4,680,334 A * 7/1987 Wallace .................. C08L 27/06
524/406
10,678,124 B2 * 6/2020 Wei ......................... G02B 5/223
(Continued)

FOREIGN PATENT DOCUMENTS

CN 102981202 A 3/2013
CN 102981306 A 3/2013
(Continued)

OTHER PUBLICATIONS

Machine translation of CN 104090418.*
(Continued)

*Primary Examiner* — Martin J Angebranndt (57) ABSTRACT

A color filter (CF) substrate, a manufacturing method thereof and a display panel are provided. The manufacturing method of the substrate includes: providing a base substrate; and forming a black matrix layer and a plurality of first
(Continued)

sub-pixel units on the base substrate, wherein the black matrix layer and the plurality of first sub-pixel units are made of photoresist of a same material, the material of the photoresist includes an irreversible thermochromic pigment, the photoresist is changed into black color upon being heated, and a color of the photoresist before color change is the same as a color of the first sub-pixel units.

13 Claims, 11 Drawing Sheets

(51) Int. Cl.
*G02F 1/1335* (2006.01)
*G03F 7/00* (2006.01)
(52) U.S. Cl.
CPC ...... *G02F 1/133514* (2013.01); *G03F 7/0007* (2013.01); *G03F 7/105* (2013.01); *G03F 7/40* (2013.01)
(58) Field of Classification Search
CPC ............ G02B 1/133512; G02B 1/1335; G02B 1/133516; G02B 1/133514
See application file for complete search history.

(56) References Cited

U.S. PATENT DOCUMENTS

| | | | |
|---|---|---|---|
| 10,712,604 B2* | 7/2020 | Ni | G02F 1/1341 |
| 2004/0109109 A1 | 6/2004 | Lee et al. | |
| 2007/0081118 A1* | 4/2007 | Lee | G02F 1/133512 |
| | | | 349/153 |
| 2010/0075848 A1* | 3/2010 | Khan | C09D 11/50 |
| | | | 503/201 |
| 2013/0342927 A1* | 12/2013 | Hino | G02F 1/133512 |
| | | | 359/891 |
| 2014/0037866 A1* | 2/2014 | Okada | C09D 11/322 |
| | | | 428/1.3 |
| 2015/0370123 A1 | 12/2015 | Yang et al. | |
| 2016/0381821 A1* | 12/2016 | Xiao | C09J 11/02 |
| | | | 361/679.01 |
| 2018/0320003 A1* | 11/2018 | Chen | G02B 6/4404 |
| 2019/0086591 A1* | 3/2019 | Wei | G03F 7/0007 |

FOREIGN PATENT DOCUMENTS

| | | | |
|---|---|---|---|
| CN | 104090418 | * | 7/2014 |
| CN | 104090413 A | | 10/2014 |
| CN | 104730739 | * | 6/2015 |
| CN | 107065290 A | | 8/2017 |
| JP | 2007-133042 | * | 5/2007 |
| JP | 2017-075222 | * | 4/2017 |
| KR | 1020040050769 A | | 6/2004 |
| KR | 1020050121303 A | | 12/2005 |

OTHER PUBLICATIONS

Machine translation of JP 2007-133042 (2007).*
Machine translation of JP 2017-075222 (2017).*
International Search Report dated Aug. 6, 2018; PCT/CN2018/086654.
Written Opinion of the International Searching Authority dated Aug. 6, 2018, PCT/CN2018/086654.

* cited by examiner

COLOUR FILM SUBSTRATE AND MANUFACTURING METHOD THEREFOR, AND DISPLAY PANEL

The present application claims the benefits of Chinese patent application No. 201710418842.2, which was filed on Jun. 6, 2017 and is fully incorporated herein by reference as part of this application.

TECHNICAL FIELD

Embodiments of the present disclosure relate to a color filter (CF) substrate, a manufacturing method thereof and a display panel.

BACKGROUND

In order to increase a transmittance of a display panel, a yellow sub-pixel is added into a pixel unit consisted of red, green and blue sub-pixels so as to form a pixel unit consisted of fours colors of red, green, blue and yellow. Such design allows the display panel to achieve a wider color gamut without consuming additional electric power. As compared to the pixel unit consisted of red, green and blue sub-pixels, the pixel unit consisted of four colors of red, green, blue and yellow sub-pixels increases its density by approximately 30%, with higher image definition as well as finer and smoother experience, in which an expressive color gamut of the blue color can be extended so as to improve an expression power thereof, and the addition of the yellow color improves an expression power of the yellow color, thereby improving the color gamut.

However, the pixel unit consisted of four colors of red, green, blue and yellow sub-pixels not only can achieve the above-mentioned advantages but also increases a production time of a color filter (CF) substrate. In an existing manufacturing process of the CF substrate, a black matrix layer, a yellow sub-pixel unit, a red sub-pixel unit, a green sub-pixel unit and a blue sub-pixel unit have to be manufactured sequentially. Between different processes, it needs to clean delivery pipes for photoresist and replace the photoresist for different colors, which results in longer time and lower production efficiency.

SUMMARY

Embodiments of the present disclosure provide a color filter (CF) substrate, a manufacturing method thereof and a display panel, in order to improve a production efficiency of the CF substrate and hence to improve a production efficiency of the display panel.

An embodiment of the present disclosure provides a manufacturing method of a color filter (CF) substrate, including: providing a base substrate; and forming a black matrix layer and a plurality of first sub-pixel units on the base substrate. The black matrix layer and the plurality of first sub-pixel units are made of photoresist of a same material, the material of the photoresist includes an irreversible thermochromic pigment, the photoresist is changed into black color upon heating, and a color of the photoresist before color change is the same as a color of the first sub-pixel units.

The embodiment of the present disclosure provides a manufacturing method of a color filter (CF) substrate, in which the black matrix layer and the sub-pixel unit are made of the photoresist of the same material so as to save steps of cleaning the delivering pipe and switching the photoresist by one time, and the photoresist can change its color by being heated so as to be used as both of the sub-pixel units and the black matrix layer.

Therefore, the manufacturing method of the CF substrate provided by the embodiment of the present disclosure achieves relatively higher production efficiency.

In the embodiment of the present disclosure, forming a black matrix layer and a plurality of first sub-pixel units on the base substrate includes: providing the photoresist on the base substrate to form a photoresist layer, exposing and developing the photoresist layer by using a first mask to form a pattern layer, the patter layer including a plurality of opening regions arranged in an array and a strip-shaped reserved region configured to form the plurality of first sub-pixel units; heating a region of the pattern layer other than a determined region to form the black matrix layer and the plurality of first sub-pixel units arranged at intervals, the determined region being located in the strip-shaped reserved region and being overlapped with a region where the plurality of first sub-pixel units are located. Therefore, this step achieves obtaining the black matrix layer and the first sub-pixel unit at the same time.

In the embodiment of the present disclosure, the first mask includes: a light-shielding region and a light-transmitting region in which the plurality of opening regions are to be formed. The pattern layer formed by using such mask includes a plurality of opening regions arranged in an array, and also includes a strip-shaped reserved region.

In the embodiment of the present disclosure, heating the region of the pattern layer other than the determined region includes: heating the pattern layer by using a heating layer, a portion of the heating layer corresponding to the determined region being a heat insulation region. The heat insulation region can be a notch, and can also be provided with a heat insulating layer, so that a portion not heated by the heating layer still remains an original color and a portion heated by the heating layer is changed into black color so as to be formed into the black matrix layer.

In the embodiment of the present disclosure, forming the black matrix layer and the plurality of first sub-pixel units on the base substrate includes: providing the photoresist on the base substrate to form a first photoresist layer, exposing and developing the first photoresist layer by using a second mask to form a pattern layer having a shape the same as that of the black matrix layer, heating the pattern layer to form the black matrix layer, providing the photoresist on the black matrix layer to form a second photoresist layer, exposing and developing the second photoresist layer by using a third mask to form the plurality of first sub-pixel units. Such step achieves obtaining the black matrix layer and the first sub-pixel unit in separate sub-steps without replacing the photoresist or cleaning the pipe.

In the embodiment of the present disclosure, a color of the first sub-pixel unit is yellow, the manufacturing method of the CF substrate further includes: forming a plurality of second sub-pixel units, a plurality of third sub-pixel units and a plurality of fourth sub-pixel units.

In the embodiment of the present disclosure, a material of the photoresist includes: 20-50 parts by weight of resin; 10-30 parts by weight of activated diluent; 20-40 parts by weight of solvent; 10-25 parts by weight of irreversible thermochromic pigment, the irreversible thermochromic pigment is $(NH_4)_3PO_4 \cdot 12MoO_3$; 1-5 part(s) by weight of photoinitiator; and 2-8 parts by weight of promotor. The photoresist formed by such material can change its color from yellow to black, upon being heated.

In the embodiment of the present disclosure, a transmittance of the photoresist is 20.1%~40.2%.

The embodiment of the present disclosure further provides a color filter (CF) substrate, including: a base substrate; a black matrix layer located on the base substrate; and a CF layer filled in an opening region of the black matrix layer. The CF layer includes sub-pixel units of multiple colors; a material of forming the black matrix layer is as same as a material of forming the sub-pixel unit of any of the multiple colors; the material includes an irreversible thermochromic pigment, and the material is changed into black color upon being heated.

The embodiment of the present disclosure further provides a display panel including the CF substrate described above.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

REFERENCE NUMERALS

1—opening region; 2—strip-shaped reserved region; 3—first sub-pixel unit; 4—black matrix layer, 51—light-shielding region; 52—light-transmitting region; 6—heat insulation region.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. Apparently, the described embodiments are only a part of but not all of embodiments of the present invention. Based on the described embodiments of the present invention, all other embodiments conceivable by those of ordinary skill in the art without creative labor shall fall into the protection scope of the present invention.

Figure 1:
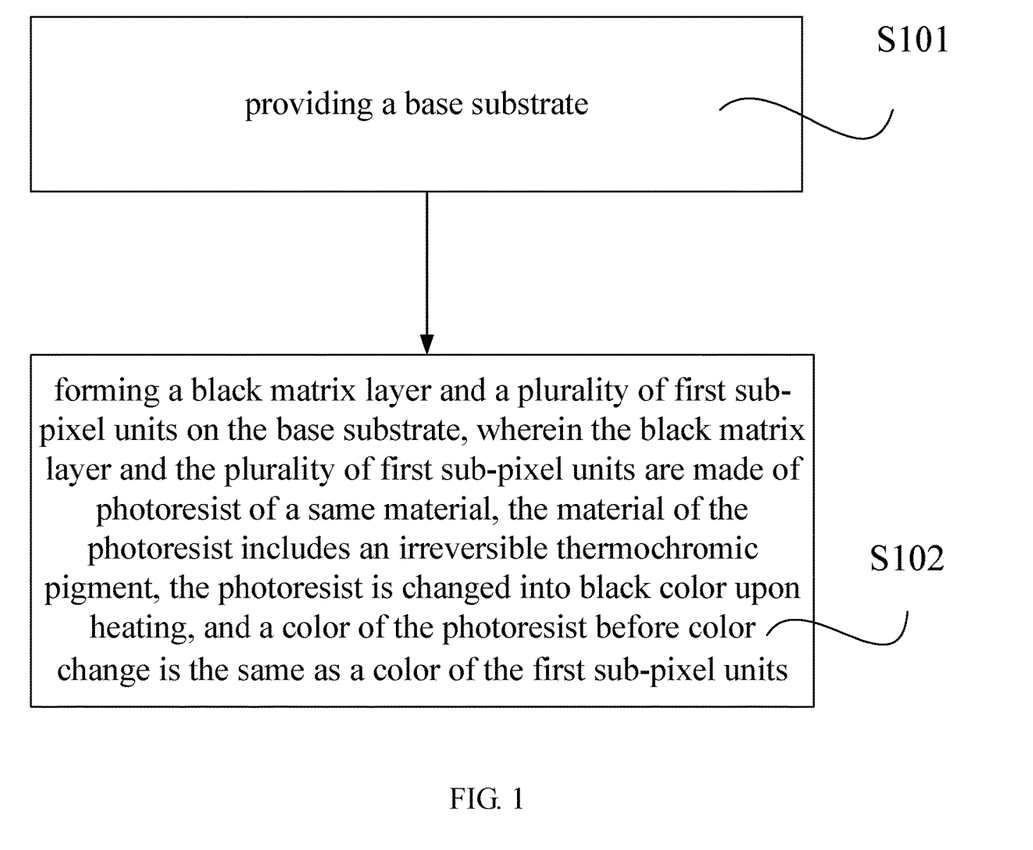
FIG. 1 is a flow chart illustrating a first manufacturing method of a CF substrate provided by an embodiment of the present disclosure.

As illustrated in FIG. 1, an embodiment of the present disclosure provides a manufacturing method of a color filter (CF) substrate, including: step S101, providing a base substrate; and step S102, forming a black matrix layer 4 and a plurality of first sub-pixel units 3 on the base substrate. The black matrix layer 4 and the plurality of first sub-pixel units 3 are made of photoresist of a same material; the material of the photoresist includes an irreversible thermochromic pigment; the photoresist will be changed into black color after being heated; and a color of the photoresist before color change is the same as a color of the first sub-pixel unit 3.

The embodiment of the present disclosure provides a manufacturing method of a CF substrate, in which the black matrix layer 4 and the sub-pixel units 3 are made of the photoresist of the same material so as to save steps of cleaning the delivering pipe and cutting the photoresist by one time, and the photoresist can change its color by heating so as to be used as both of the sub-pixel unit and the black matrix layer 4.

Therefore, the manufacturing method of the CF substrate as provided by the embodiment of the present disclosure achieves relatively higher production efficiency.

The first sub-pixel unit 3 and the black matrix layer 4 described above can be manufactured by multiple ways.

Figure 2:
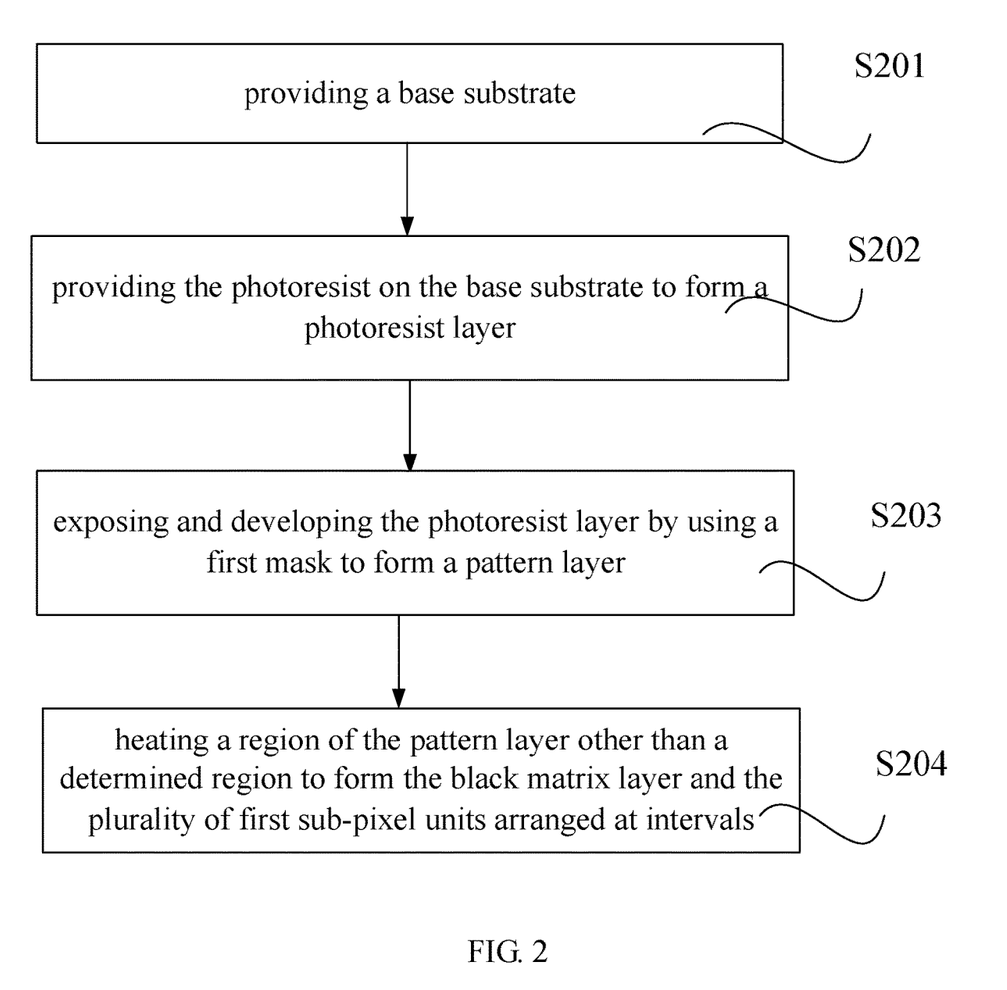
FIG. 2 is a flow chart illustrating a second manufacturing method of a CF substrate as provided by an embodiment of the present disclosure.

In an embodiment provided by the present disclosure, as illustrated in FIG. 2, the manufacturing method of the CF substrate as provided by the embodiment of the present disclosure includes: step S201, providing a base substrate; and as compared to the step illustrated in FIG. 1, the step S102 of forming a black matrix layer 4 and a plurality of first sub-pixel units 3 includes steps as below.

Step S202, providing the photoresist on the base substrate to form a photoresist layer.

Step S203, exposing and developing the photoresist layer by using a first mask to form a pattern layer including a plurality of opening regions 1 arranged in an array and a strip-shaped reserved region 2 configured to form the plurality of first sub-pixel units 3. The pattern layer as formed has a shape as illustrated in FIG. 3.

Figure 4:
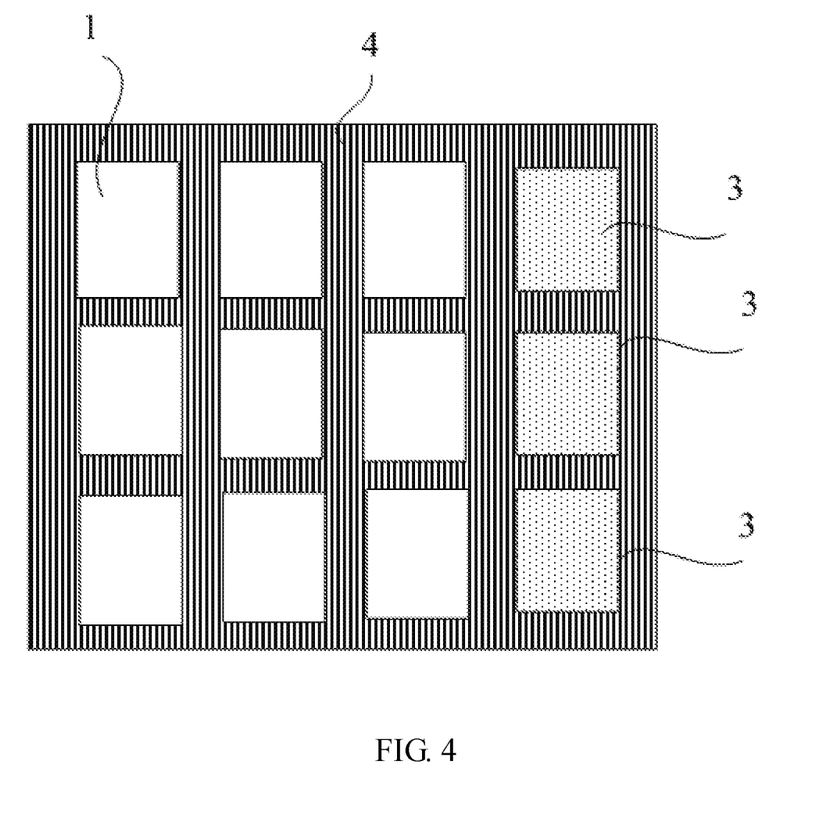
FIG. 4 is a structural diagram upon forming a first sub-pixel unit and a black matrix layer, as provided by an embodiment of the present disclosure.

Step S204, heating a region of the pattern layer other than a determined region 21 to form the black matrix layer 4 and the plurality of first sub-pixel units 3 arranged at intervals. The determined region 21 is located in the strip-shaped reserved region 2 and is overlapped with a region where the plurality of first sub-pixel units 3 as formed is located. A structure as formed after fishing this step is illustrated in FIG. 4.

Usually, after providing a base substrate, an electrode layer is generally formed on the base substrate, and then steps S202, S203 and S204 are completed sequentially; after finishing the step S204, sub-pixel units of other colors can be formed in other opening regions 1, and then an alignment layer, a spacer and the like can be manufactured.

Figure 3:
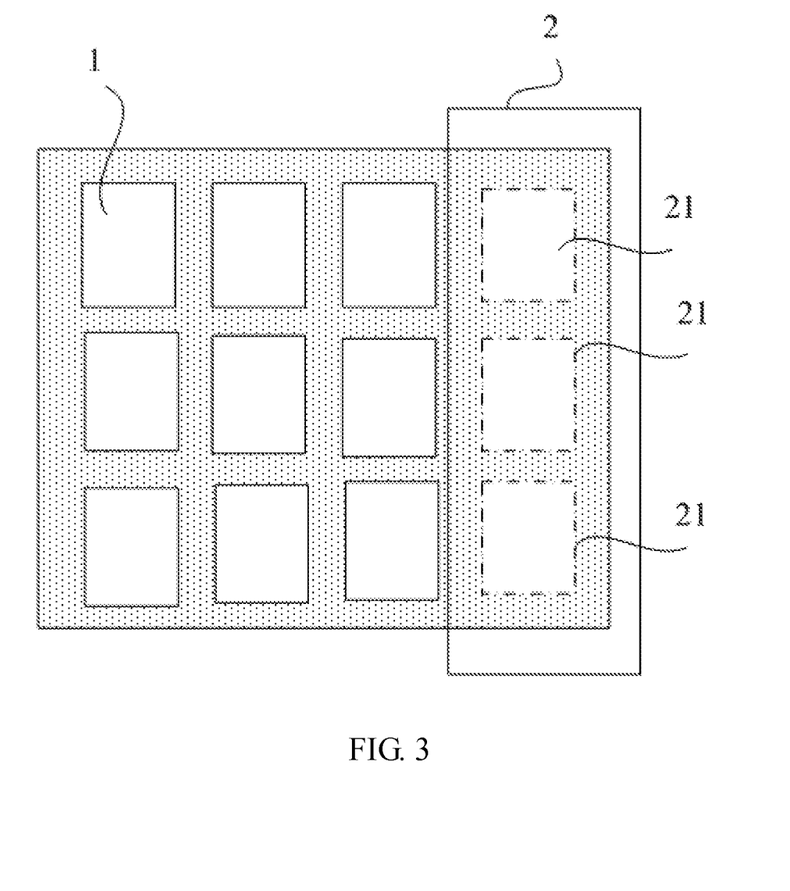
FIG. 3 illustrates a pattern layer formed by exposing and developing a photoresist layer by using a first mask, as provided by an embodiment of the present disclosure.
Figure 5:
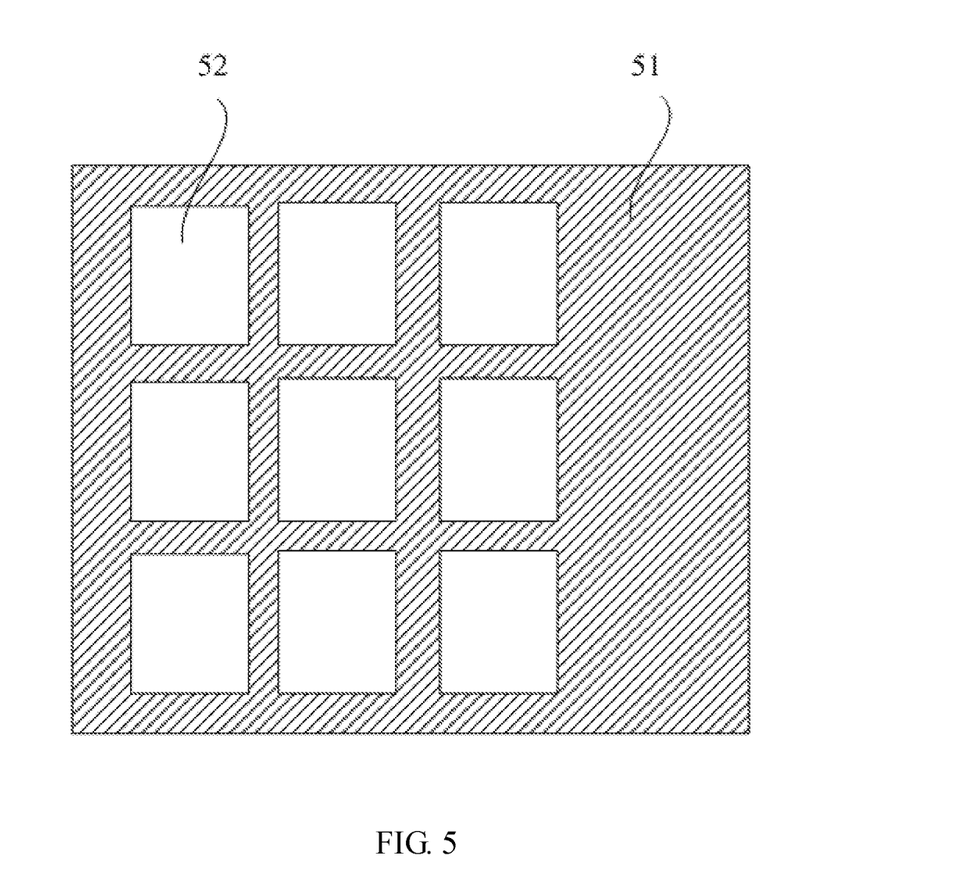
FIG. 5 is a structural diagram of the first mask as provided by an embodiment of the present disclosure.

In order to form the pattern layer as illustrated in FIG. 3, as illustrated in FIG. 5, the first mask includes a light-shielding region 51 and a light-transmitting region 52 configured to form a plurality of opening regions 1. The pattern layer formed by using this mask includes a plurality of opening regions 1 arranged in an array, and also includes a strip-shaped reserved region.

Figure 6:
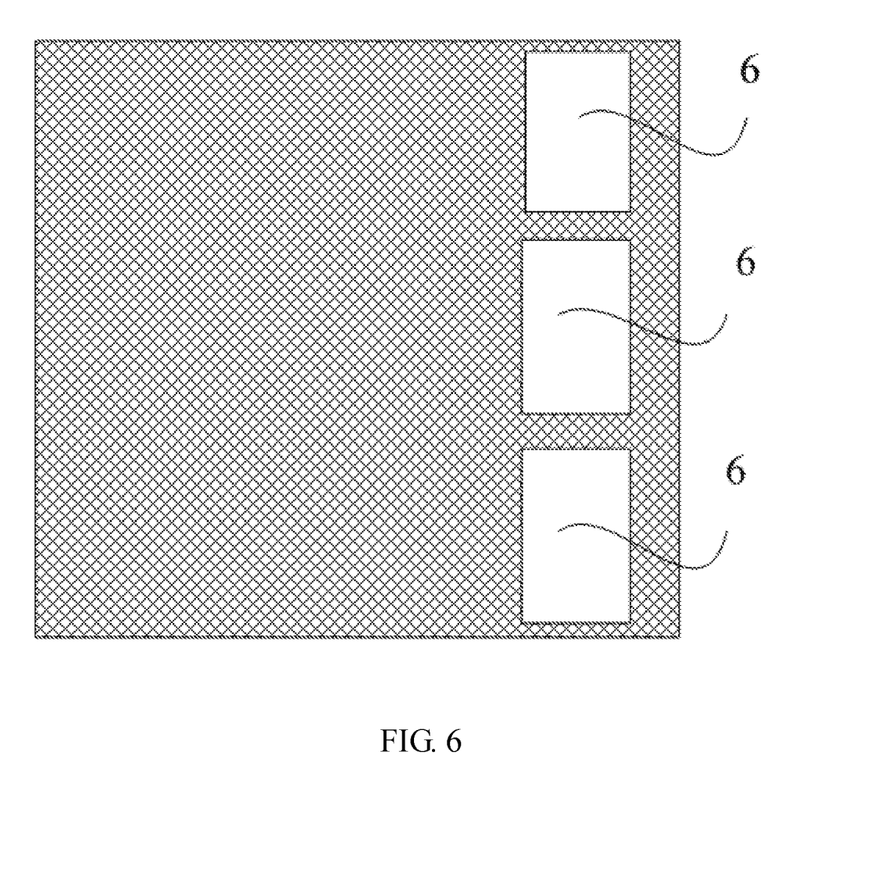
FIG. 6 is a first structural diagram of a heating layer as provided by an embodiment of the present disclosure.

Heating the pattern layer as described above can be achieved by multiple ways, for example, heating by using a resistance wire, heating by using liquid and the like. In an embodiment provided by the present disclosure, in the above-mentioned step S204, heating the region of the pattern layer other than the determined region 21 includes: heating the pattern layer by using a heating layer. As illustrated in FIG. 6, a portion of the heating layer corresponding to the determined region 21 is a heat insulation region 6. The heat insulation region 6 can be a notch, and can also be provided with a heat insulating layer. In this way, a portion not heated by the heating layer still remains its original color, and a portion heated by the heating layer is changed into black so as to be formed into the black matrix layer 4.

Figure 7:
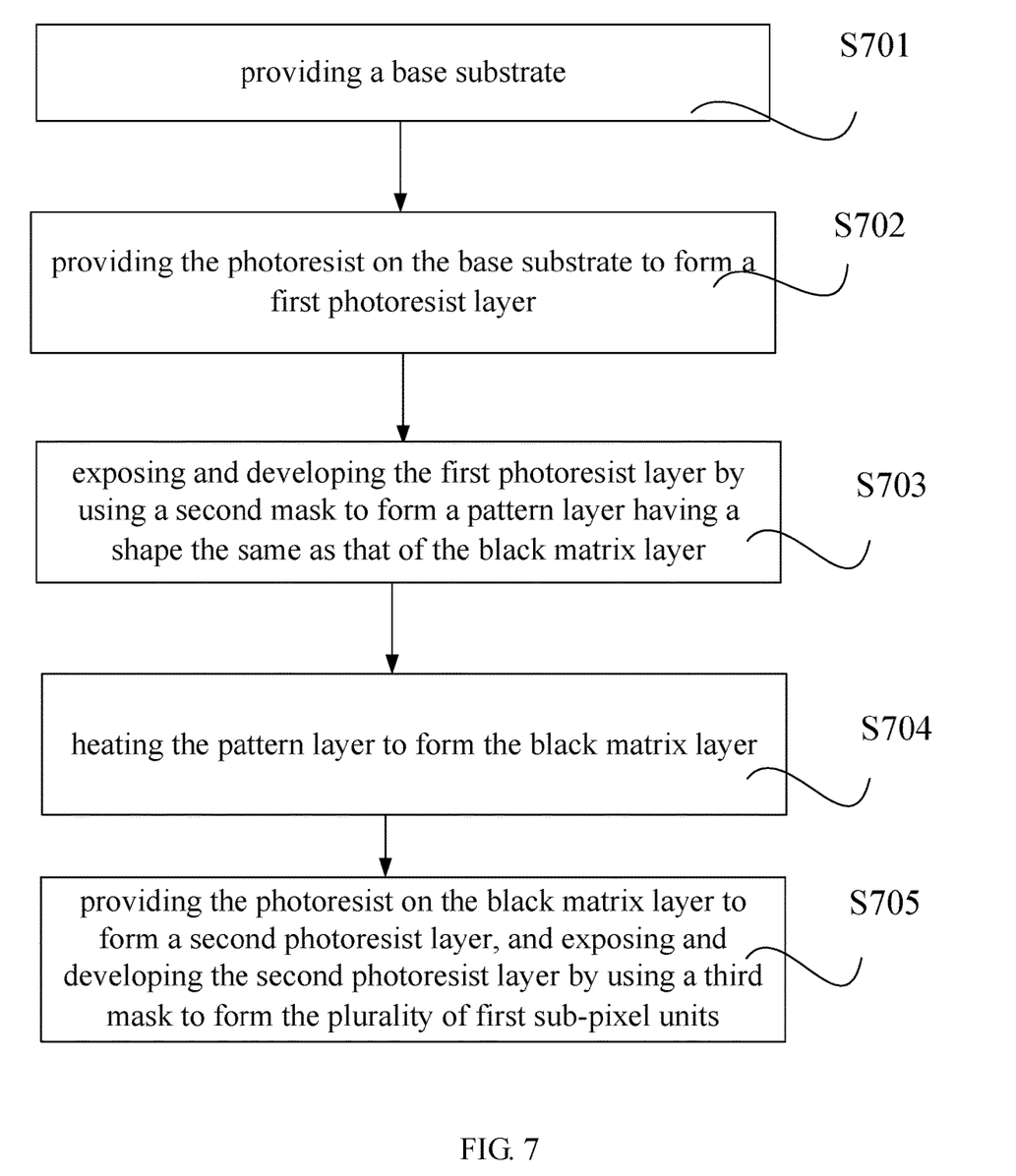
FIG. 7 is a flow chart illustrating a third manufacturing method of a CF substrate as provided by an embodiment of the present disclosure.

In another embodiment provided by the present disclosure, as illustrated in FIG. 7, the manufacturing method of the CF substrate provided by the embodiment of the present disclosure includes: step S701, providing a base substrate; and as compared to the step illustrated in FIG. 1, the step S102 of forming a black matrix layer 4 and a plurality of first sub-pixel units 3 includes the steps as below.

Step S702, providing the photoresist on the base substrate to form a first photoresist layer.

Figure 8:
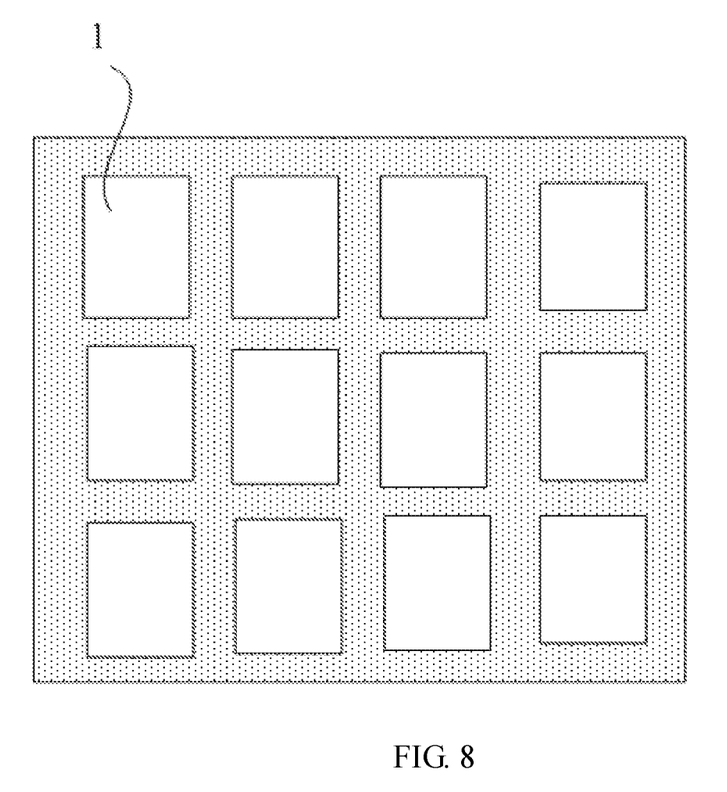
FIG. 8 illustrates a pattern layer formed by exposing and developing a photoresist layer by using a second mask, as provided by an embodiment of the present disclosure.

Step S703, exposing and developing the first photoresist layer by using a second mask to form a pattern layer having a shape the same as that of the black matrix layer 4. The shape of the pattern layer as formed is illustrated in FIG. 8.

Figure 9:
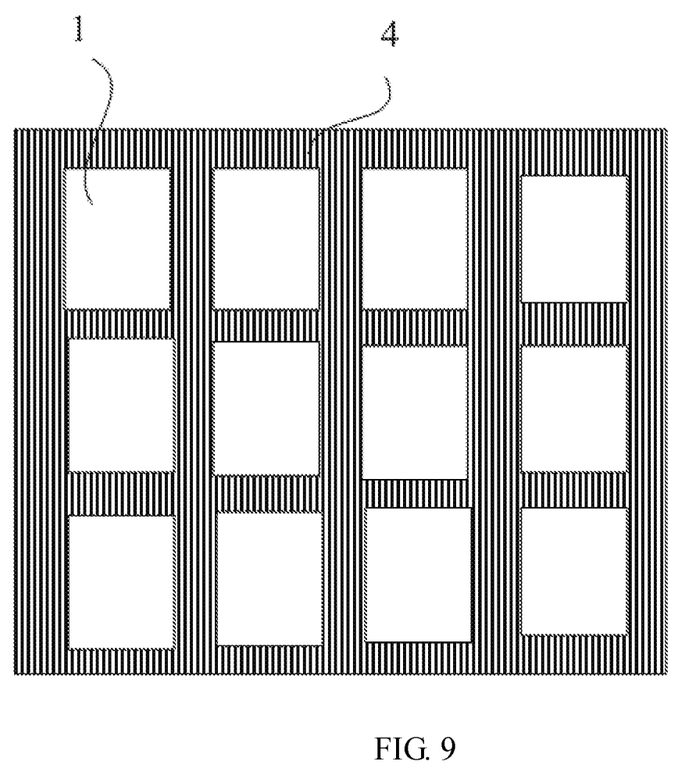
FIG. 9 is a structural diagram of the patterning layer as illustrated in FIG. 8 after being heated.

Step S704, heating the pattern layer to form the black matrix layer 4. The structure as formed is illustrated in FIG. 9.

Step S705, providing photoresist on the black matrix layer 4 to form a second photoresist layer, exposing and developing the second photoresist layer by using a third mask to form the plurality of first sub-pixel units 3. Such step achieves obtaining the black matrix layer 4 and the first sub-pixel units 3 in separate sub-steps without replacing the photoresist or cleaning the pipe.

Usually, after providing a base substrate, an electrode layer is generally formed on the base substrate, and then steps S702, S703, S704 and S705 are completed sequentially; after the step S705 is completed, sub-pixel units of other colors can be formed in other opening regions 1, and then an alignment layer, a spacer and the like can be manufactured.

Figure 10:
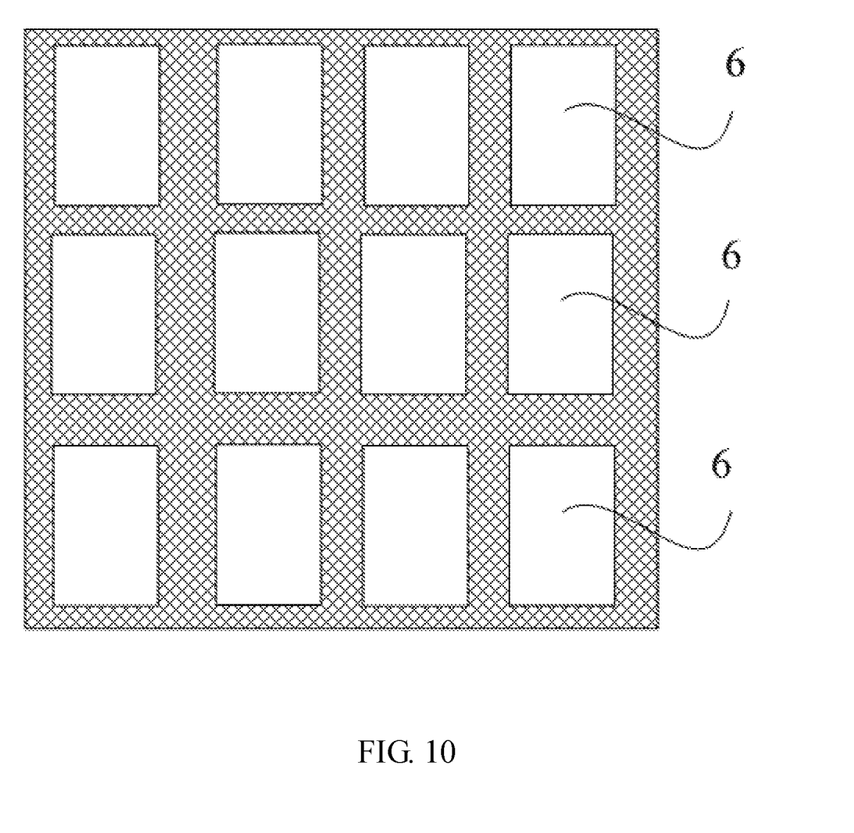
FIG. 10 is a second structural diagram of the heating layer as provided by an embodiment of the present disclosure.

Heating the pattern layer as described above can be achieved by multiple ways, for example, heating by using a resistance wire, heating by using liquid and the like. In an embodiment provided by the present disclosure, the above-mentioned step S704 of heating the pattern layer to form the black matrix layer 4 includes: heating the pattern layer by using a heating layer. As illustrated in FIG. 10, a portion of the heating layer corresponding to the opening region 1 is a heat insulation region 6. The heat insulation region 6 can be a notch, and can also be provided with a heat insulating layer. In this way, a portion not heated by the heating layer still remains its original color, and a portion heated by the heating layer will be changed into black color so as to be formed into the black matrix layer 4.

Figure 11:
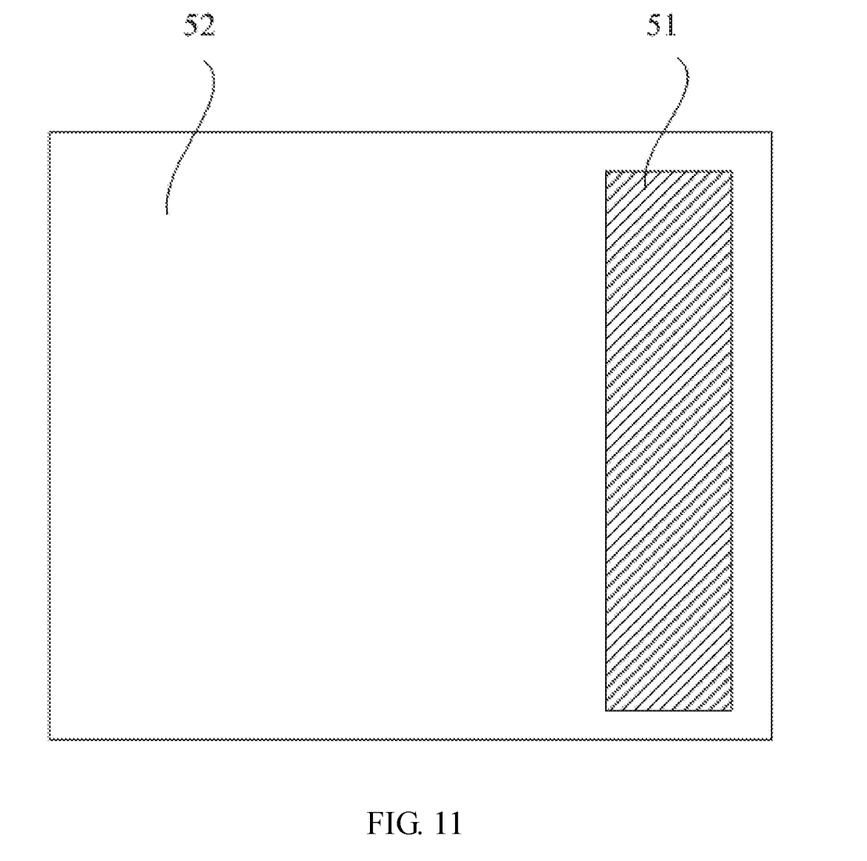
FIG. 11 is a structural diagram of a third mask as provided by an embodiment of the present disclosure.

In order to form the pattern layer as illustrated in FIG. 8, as illustrated in FIG. 11, the second mask includes a light-shielding region 51 and a light-transmitting region 52 configured to form a plurality of opening regions 1; such structure is the same as that used in manufacturing a black matrix layer 4 in the existing technology; and/or, the third mask includes: a light-shielding region 51 and a strip-shaped light-transmitting region 52 configured to form the plurality of first sub-pixel units 3.

A color of the first sub-pixel unit 3 described above can be red, green, blue or yellow. In an embodiment provided by the present disclosure, the color of the first sub-pixel unit 3 is yellow, and the manufacturing method of the CF substrate further includes: forming a plurality of second sub-pixel units, a plurality of third sub-pixel units and a plurality of fourth sub-pixel units.

For example, a material of the photoresist includes: 20-50 parts by weight of resin; 10-30 parts by weight of activated diluent; 20-40 parts by weight of solvent; 10-25 parts by weight of irreversible thermochromic pigment, the irreversible thermochromic pigment is $(NH_4)_3PO_4.12MoO_3$; 1-5 part(s) by weight of photoinitiator, and 2-8 parts by weight of promotor. The photoresist formed by such material can change its color from yellow to black upon being heated.

Activated diluent mainly refers to an epoxy compound which contains an epoxy group and has low molecular weight. It can enter into a reaction of epoxy resin and becomes a part of a crosslinking network structure of a condensate of the epoxy resin. Photoinitiator is also referred to as photosensitizer or photocuring agent, and is a kind of compound which can absorb energy of a certain wavelength within the ultraviolet region (250-420 nm) or within the visible region (400-800 nm) to generate free radical, positive ion and the like, so as to initiate aggregation and crosslinking solidity of monomers.

For example, the activated diluent above can be tripropylene glycol diacrylate (TPGDA) and phenylglycidyl ester. The above mentioned promotor includes defoamer and flatting agent. The defoamer can be polyoxyethylene polyoxypropylene ether (BAPE); the flatting agent can be acrylate copolymer and organosilicone modified acrylic acid.

The transmittance of the photoresist formed by using the above-mentioned materials is 20.1%~40.2%. For example, the transmittance can be 20.1%, 20.5%, 25%, 28%, 35%, 40%, 40.3% and the like, without particularly described herein.

The photoresist described above can contain various constitutions. For example, one kind of photoresist can include: 20 parts by weight of resin, 30 parts by weight of activated diluent, 20 parts by weight of solvent, 20 parts by weight of irreversible thermochromic pigment, 5 parts by weight of photoinitiator, and 5 parts by weight of promotor. Another kind of photoresist can include: 30 parts by weight of resin, 10 parts by weight of activated diluent, 40 parts by weight of solvent, 10 parts by weight of irreversible thermochromic pigment, 5 parts by weight of photoinitiator, and 5 parts by weight of promotor. Yet another kind of photoresist can include: 50 parts by weight of resin, 10 parts by weight of activated diluent, 20 parts by weight of solvent, 10 parts by weight of irreversible thermochromic pigment, 5 parts by weight of photoinitiator, and 5 parts by weight of promotor. Further another kind of photoresist can include: 20 parts by weight of resin, 20 parts by weight of activated diluent, 41 parts by weight of solvent, 10 parts by weight of irreversible thermochromic pigment, 1 part by weight of photoinitiator, and 8 parts by weight of promotor. Yet further another kind of photoresist can include: 20 parts by weight of resin, 10 parts by weight of activated diluent, 40 parts by weight of solvent, 25 parts by weight of irreversible thermochromic pigment, 3 parts by weight of photoinitiator, and 2 parts by weight of promotor.

The embodiment of the present disclosure further provides a manufacturing method of a display panel, including the manufacturing method of the CF substrate described in the embodiments above. Because the manufacturing method of the CF substrate described above achieves relatively higher production efficiency for saving steps of cleaning the delivering pipe and cutting the photoresist by one time, the manufacturing method of the display panel provided by the embodiment of the present disclosure also achieves relatively higher production efficiency.

The embodiment of the present disclosure further provides a CF substrate, including a base substrate; a black matrix layer located on the base substrate; and a CF layer filled in an opening region of the black matrix layer. The CF layer includes sub-pixel units of multiple colors; a material for forming the black matrix layer is the same as a material for forming the sub-pixel unit of any of the multiple colors, the material includes an irreversible thermochromic pigment, and the material can be changed into black color upon being heated.

The material of the photoresist includes: 20-50 parts by weight of resin; 10-30 parts by weight of activated diluent; 20-40 parts by weight of solvent; 10-25 parts by weight of irreversible thermochromic pigment, the irreversible thermochromic pigment is $(NH_4)_3PO_4 \cdot 12MoO_3$; 1-5 part(s) by weight of photoinitiator, and 2-8 parts by weight of promotor. The photoresist formed by such material can change its color from yellow to black upon being heated.

Activated diluent mainly refers to an epoxy compound which contains an epoxy group and has low molecular weight. It can enter into a reaction of epoxy resin and becomes a part of a crosslinking network structure of a condensate of the epoxy resin. Photoinitiator is also referred to as photosensitizer or photocuring agent, and is a kind of compound which can absorb energy of a certain wavelength within the ultraviolet range (250-420 nm) or within the visible range (400-800 nm) to generate free radical, positive ion and the like, so as to initiate aggregation and crosslinking solidity of monomers.

For example, the activated diluent mentioned above can be tripropylene glycol diacrylate (TPGDA) and phenylglycidyl ester. The promotor above includes defoamer and flatting agent. The defoamer can be polyoxyethylene polyoxypropylene ether (BAPE); the flatting agent can be acrylate copolymer and organosilicone modified acrylic acid.

The transmittance of the photoresist formed by using the above-mentioned materials is 20.1%~40.2%.

The photoresist described above can contain various constitutions. For example, one kind of photoresist can include: 20 parts by weight of resin, 30 parts by weight of activated diluent, 20 parts by weight of solvent, 20 parts by weight of irreversible thermochromic pigment, 5 parts by weight of photoinitiator, and 5 parts by weight of promotor. Another kind of photoresist can include: 30 parts by weight of resin, 10 parts by weight of activated diluent, 40 parts by weight of solvent, 10 parts by weight of irreversible thermochromic pigment, 5 parts by weight of photoinitiator, and 5 parts by weight of promotor. Yet another kind of photoresist can include: 50 parts by weight of resin, 10 parts by weight of activated diluent, 20 parts by weight of solvent, 10 parts by weight of irreversible thermochromic pigment, 5 parts by weight of photoinitiator, and 5 parts by weight of promotor. Further another kind of photoresist can include: 20 parts by weight of resin, 20 parts by weight of activated diluent, 41 parts by weight of solvent, 10 parts by weight of irreversible thermochromic pigment, 1 part by weight of photoinitiator, and 8 parts by weight of promotor. Further yet another kind of photoresist can include: 20 parts by weight of resin, 10 parts by weight of activated diluent, 40 parts by weight of solvent, 25 parts by weight of irreversible thermochromic pigment, 3 parts by weight of photoinitiator, and 2 parts by weight of promotor.

The embodiment of the present disclosure further provides a display panel including the CF substrate described in the embodiments above. The display panel can be any device with display function such as a mobile phone and a computer.

The above are merely specific implementations of the present disclosure without limiting the protection scope of the present disclosure thereto. The protection scope of the present disclosure should be based on the protection scope of the appended claims.

What is claimed is:

1. A manufacturing method of a color filter (CF) substrate, comprising:
    providing a base substrate; and
    forming a black matrix layer and a plurality of first sub-pixel units on the base substrate, by coating a photoresist and patterning the photoresist to form the black matrix layer and the plurality of sub-pixel units in the same photoresist material, which comprises a red, green, blue or yellow pigment and an irreversible thermochromic pigment, the photoresist is capable of being changed into black color upon being heated, and a color of the photoresist before color change is the same as a color of the first sub-pixel units which is red, blue, green or yellow, the black matrix layer is formed by selectively heating the photoresist which is red, blue, green or yellow in the desired black matrix layer pattern to color the photoresist black,
    wherein a weight percent of the irreversible thermochromic pigment is more than 10 wt % and less than or equal to 25 wt %.

2. The manufacturing method of the color filter substrate according to claim 1, wherein forming the black matrix layer and the plurality of first sub-pixel units on the base substrate comprises:
    providing the photoresist on the base substrate to form a photoresist layer;
    patterning the photoresist layer to form a pattern layer, the pattern layer comprising a plurality of opening regions arranged in an array and a strip-shaped reserved region configured to form the plurality of first sub-pixel units; and
    heating a region of the pattern layer other than a determined region to form the black matrix layer and the plurality of first sub-pixel units arranged at intervals, the determined region being located in the strip-shaped reserved region and being overlapped with a region where the plurality of first sub-pixel units is located.

3. The manufacturing method of the color filter substrate according to claim 2, wherein patterning the photoresist layer is performed with a first mask, and the first mask comprises a light-shielding region and a light-transmitting region in which the plurality of opening regions is to be formed.

4. The manufacturing method of the color filter substrate according to claim 2, wherein heating the region of the pattern layer other than the determined region comprises:
    heating the pattern layer by using a heating layer, a portion of the heating layer corresponding to the determined region being a heat insulation region.

5. The manufacturing method of the color filter substrate according to claim 4, wherein the heat insulation region comprises a notch or a heat insulating layer.

6. The manufacturing method of the color filter substrate according to claim 1, wherein forming the black matrix layer and the plurality of first sub-pixel units on the base substrate comprises:
   providing the photoresist on the base substrate to form a first photoresist layer;
   patterning the first photoresist layer to form a pattern layer having a shape the same as that of the black matrix layer;
   heating the pattern layer to form the black matrix layer; and
   providing the photoresist on the black matrix layer to form a second photoresist layer, patterning the second photoresist layer to form the plurality of first sub-pixel units.

7. The manufacturing method of the color filter substrate according to claim 1, wherein a color of the first sub-pixel unit is yellow,
   the manufacturing method of the color filter substrate further comprises: forming a plurality of second sub-pixel units, a plurality of third sub-pixel units and a plurality of fourth sub-pixel units.

8. The manufacturing method of the color filter substrate according to claim 7, wherein, in addition to the red, green, blue or yellow pigment, the photoresist material further comprises:
   20-50 parts by weight of resin;
   10-30 parts by weight of activated diluent;
   20-40 parts by weight of solvent;
   1-5 part(s) by weight of photoinitiator; and
   2-8 parts by weight of promotor,
   wherein the irreversible thermochromic pigment is $(NH_4)_3PO_4.(MoO_3)_{12}$.

9. The manufacturing method of the color filter substrate according to claim 8, wherein a transmittance of the photoresist before the color change is 20.1%~40.2%.

10. The manufacturing method of the color filter substrate according to claim 7, wherein the first through fourth sub-pixel units are respectively color filters with different colors.

11. The manufacturing method of the color filter substrate according to claim 10, wherein the second sub-pixel units are red color filter, the third sub-pixel units are green color filters, and the fourth sub-pixel units are blue color filters.

12. A color filter substrate, comprising:
   a base substrate;
   a black matrix layer located on the base substrate; and
   a color filter layer filled in an opening region of the black matrix layer, the color filter layer comprising first sub-pixel units of a same color which is red, blue green or yellow, wherein
   a photoresist for forming the black matrix layer is the same as a photoresist for forming the first sub-pixel units,
   a material of the photoresist comprises a red, green, blue or yellow pigment and an irreversible thermochromic pigment which is red, blue green or yellow, and
   the photoresist is capable of being changed into black color upon being heated,
   wherein a weight percent of the irreversible thermochromic pigment is more than 10 wt % and less than or equal to 25 wt %.

13. A display panel comprising the color filter substrate according to claim 12.

* * * * *